US005570318A

United States Patent [19]
Ogawa

[11] Patent Number: 5,570,318
[45] Date of Patent: Oct. 29, 1996

[54] SEMICONDUCTOR MEMORY DEVICE INCORPORATING REDUNDANCY MEMORY CELLS

[75] Inventor: Sumio Ogawa, Tokyo, Japan

[73] Assignee: NEC Corporation, Tokyo, Japan

[21] Appl. No.: 563,940

[22] Filed: Nov. 29, 1995

[30] Foreign Application Priority Data

Nov. 29, 1994 [JP] Japan .................................. 6-294412

[51] Int. Cl.$^6$ .................................................. G11C 29/00
[52] U.S. Cl. ..................... 365/200; 365/203; 365/225.7; 365/230.03; 365/230.06
[58] Field of Search .............................. 365/200, 230.03, 365/230.06, 203, 225.7, 96

[56] References Cited

U.S. PATENT DOCUMENTS

| | | | |
|---|---|---|---|
| 5,265,055 | 11/1993 | Horiguchi et al. | 365/200 |
| 5,469,388 | 11/1995 | Park | 365/200 |
| 5,485,418 | 4/1996 | Hiraks et al. | 365/200 X |
| 5,517,450 | 5/1996 | Ohsawa | 365/200 |

FOREIGN PATENT DOCUMENTS

| | | |
|---|---|---|
| 2258066 | 1/1993 | United Kingdom. |
| 2273187 | 6/1994 | United Kingdom. |

*Primary Examiner*—Do Hyun Yoo
*Attorney, Agent, or Firm*—Sughrue, Mion, Zinn, Macpeak & Seas

[57] ABSTRACT

In a semiconductor memory device including a plurality of memory cell clocks each having a normal memory cell array and first and second redundancy memory cell rows, one first redundancy row selecting circuit is provided for each of the memory cell blocks to access the first redundancy memory cell row upon receipt of a respective memory cell block selection signal, and one second redundancy row selecting circuit is provided for at least two of the memory cell blocks to access the second redundancy memory cell row upon receipt of a respective memory cell block selection signal.

12 Claims, 13 Drawing Sheets

SEMICONDUCTOR MEMORY DEVICE INCORPORATING REDUNDANCY MEMORY CELLS

BACKGROUND OF THE INVENTION

1. Field of the Invention

The present invention relates to a semiconductor device and, more particularly, to an improvement of a redundancy decoder portion thereof.

2. Description of the Related Art

In a prior art semiconductor memory device including a plurality of memory cell blocks, two redundancy memory cell rows (or columns) are incorporated into each of the memory cell blocks. In this case, two redundancy decoders are provided for each of the memory cell blocks. In other words, the number of redundancy decoders is twice that of memory cell blocks. Therefore, when two defectice memory cells are found in one of the memory cell blocks, addresses (hereinafter, referred to as defective addresses) of the cells are written into the redundancy decoders of the same memory cell block by laser trimming or the like. As a result, when one of the defective addresses is received by its corresponding redundancy decoder the redundancy decoder deactivates the normal memory cells of the same memory cell block and in its place, selects the corresponding redundancy memory cell row (or column). Thus, the defective memory cell is replaced by a redundancy memory cell, and alleviated. This will be explained later in detail.

In the above-described prior art semiconductor memory device, however, since the number of redundancy decoders is too large, the integration of the device is low.

SUMMARY OF THE INVENTION

It is an object of the present invention to improve the integration of a semiconductor memory device including memory cell blocks each having a normal memory cell array and two redundancy cell rows (or columns), without reducing the manufacturing yield.

According to the present invention, in a semiconductor memory device including a plurality of memory cell blocks each having a normal memory cell array and first and second redundancy memory cell rows (or columns), one first redundancy row (or column) selecting circuit is provided for each of the memory cell blocks to access the first redundancy memory cell row (or column) upon receipt of a respective memory cell block selection signal, and one second redundancy row (or column) selecting circuit is provided for at least two of the memory cell blocks to access the second redundancy memory cell row (or column) upon receipt of a respective memory cell block selection signal.

Thus, the mumber of redundancy row (or column) selecting circuits is reduced, to thereby raise the integration of the device.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor memory devices incorporating redundancy memory cells will be explained with reference to FIGS. 1 through 4.

Figure 1:
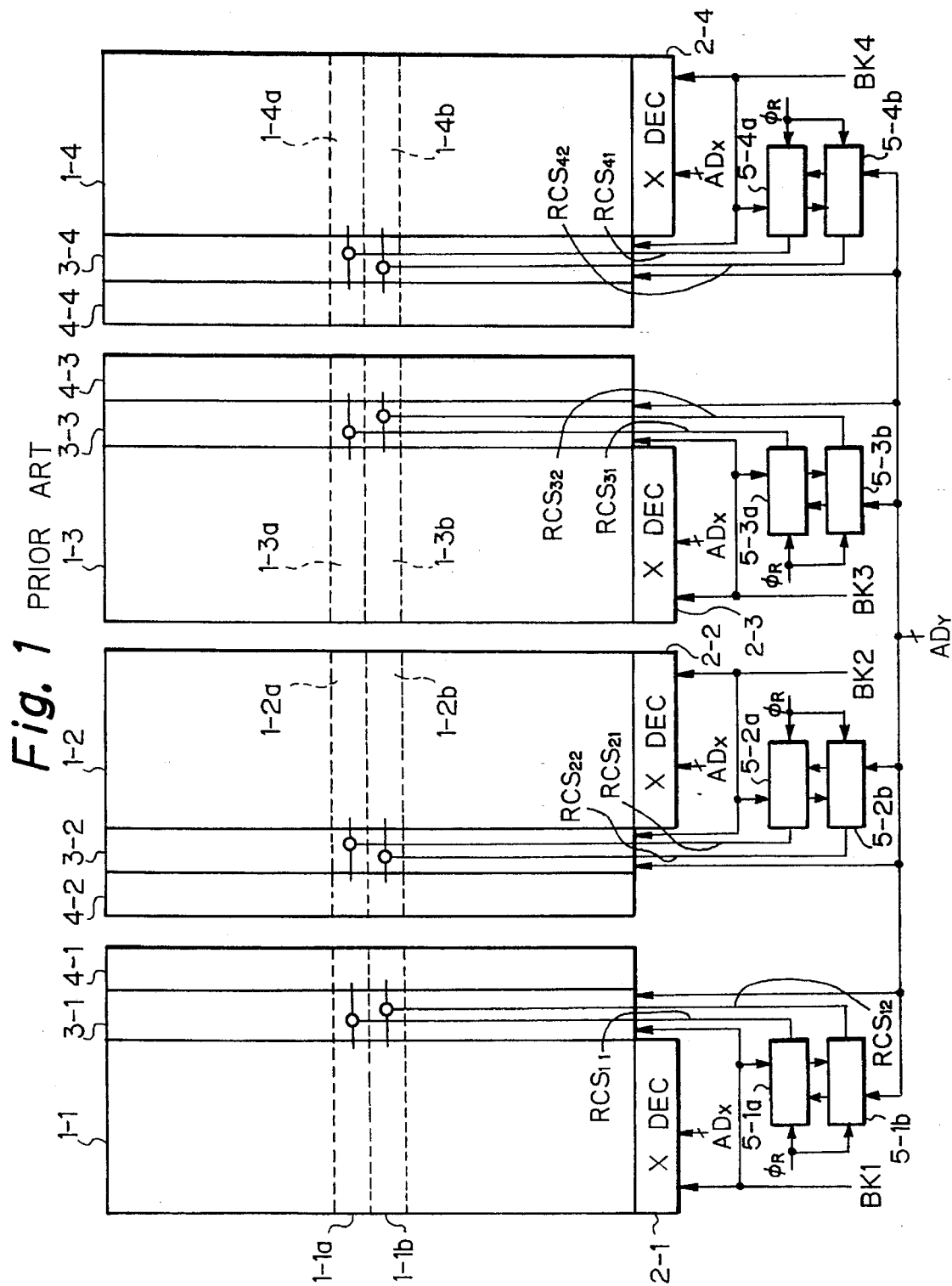
FIG. 1 is a block circuit diagram illustrating a prior art semiconductor memory device incorporating redundancy memory cells.

In FIG. 1, which illustrates a prior art semiconductor memory device, reference numerals 1-1, 1-2, 1-3 and 1-4 designate memory cell blocks each including a normal memory cell array as well as two redundancy memory cell columns such as 1-1a 1-1b.

X decoders (row decoders) 2-1, 2-2, 2-3 and 2-4 are provided for the memory cell blocks 1-1, 1-2 1-3 and 1-4, respectively. Also, Y decoders (column decoders) 3-1, 3-2, 3-3 and 3-4 including Y switch circuits and sense amplifiers 4-1, 4-2, 4-3 and 4-4 are provided for the memory cell blocks 1-1, 1-2, 1-3 and 1-4, respectively. The X decoders 2-1, 2-2, 2-3 and 2-4 receive an m-bit X address signal $AD_X$, and the Y decoders 3-1, 3-2, 3-3 and 3-4 recieve an n-bit Y address signal $AD_Y$.

The redundancy memory cell columns 1-1a, 1-1b, 1-2a, 1-2b, 1-3a, 1-3b, 1-4a and 1-4b are selected by redundancy Y decoders (redundancy column decoders) 5-1a, 5-1b, 5-2a, 5-2b, 5-3a, 5-3b, 5-4a and 5-4b, respectively, not by the Y decoders 3-1, 3-2, 3-3 and 3-4.

The X decoder 2-1, the Y decoder 3-1, and the redundancy Y decoders 5-1a and 5-1b are activated by a memory cell block selection signal BK1. The X decoder 2-2, the Y decoder 3-2, and the redundancy Y decoders 5-2a and 5-2b are activated by a memory cell block selection signal BK2. The X decoder 2-3, the Y decoder 3-3, and the redundancy Y decoders 5-3a and 5-3b are activated by a memory cell block selection signal BK3. The X decoder 2-4 the Y decoder 3-4 and the redundancy Y decoders 5-4a and 5-4b are activated by a memory cell block selection signal BK4.

Also, the redundancy Y decoders 5-1a, 5-1b, 5-2a, 5-2b, 5-3a, 5-3b, 5-4a and 5-4b are precharged by a clock signal $\phi_R$.

Figure 2:
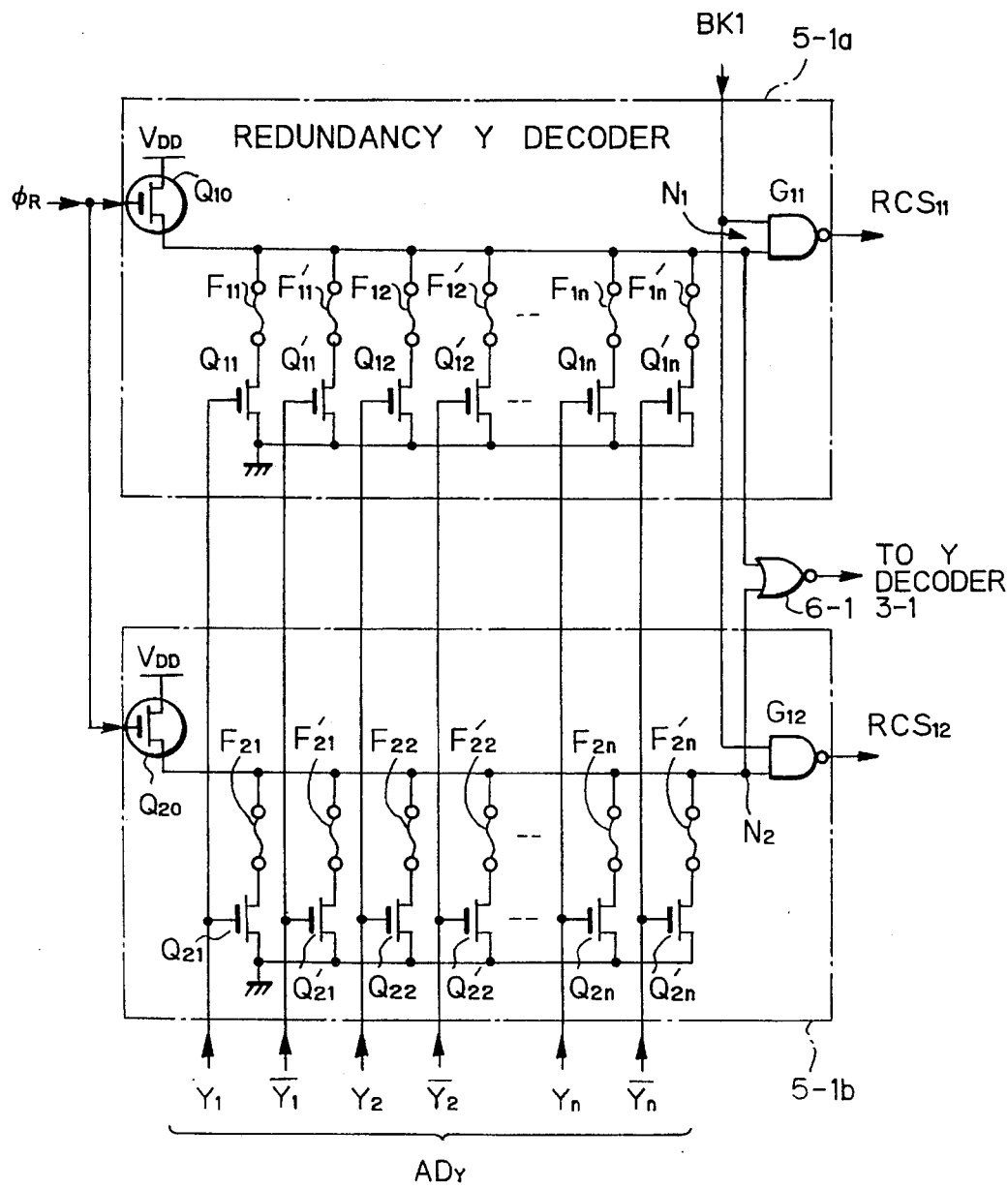
FIG. 2 is a circuit diagram of the redundancy column decoders of FIG. 1.

Further, when the redundancy Y decoder such as 5-1a selects the redundancy memory cell column 1-1a, the Y decoder 3-1 is disabled by a normal memory cell array disabling signal $\phi_d$ which is shown not in FIG. 1 but is shown in FIG. 2.

In FIG. 2, which is a detailed circuit diagram of the redundancy Y decoders 5-1a and 5-1b of FIG. 1, each of the redundancy Y decoders 5-1a and 5-1b is comprised of a fuse-type NOR-type read-only memory (PROM). For example, the redundancy Y decoder 5-1a includes a precharging P-channel MOS transistor $Q_{10}$, fuses $F_{11}, F_{11}', F_{12}, F_{12}', \ldots, F_{1n}, F_{1n}'$, and N-channel MOS transistors $Q_{11}, Q_{11}', Q_{12}, Q_{12}', \ldots, Q_{1n}, Q_{1n}'$, and a NAND circuit $G_{11}$. In this case, the transistors $Q_{11}, Q_{11}', Q_{12}, Q_{12}', \ldots, Q_{1n}, Q_{1n}'$ are controlled by Y address signals $Y_1, \overline{Y}_1, Y_2, \overline{Y}_2, \ldots, Y_n, \overline{Y}_n$, respectively. Similarly, the redundancy Y decoder 5-1b includes a precharging P-channel MOS transistor $Q_{20}$, fuses $F_{21}, F_{21}', F_{22}, F_{22}', \ldots, F_{1n}, F_{1n}'$, and N-channel MOS transistors $Q_{21}, Q_{21}', Q_{22}, Q_{22}', \ldots, Q_{2n}, Q_{2n}'$, and a NAND circuit $G_{12}$. In this case, the transistors $Q_{21}, Q_{21}', Q_{22}, Q_{22}', \ldots, Q_{2n}, Q_{2n}'$ are controlled by the Y address signals $Y_1, \overline{Y}_1, Y_2, \overline{Y}_2, \ldots, Y_n, \overline{Y}_n$, respectively.

Also, a NOR circuit 6-1 is connected to the redundancy Y decoders 5-1a and 5-1b. As a result, when the redundancy Y decoder 5-1a or 5-1b generates a redundancy memory cell column selection signal $RCS_{11}$ or $RCS_{12}$ to select the redundancy memory cell column 1-1a or 1-1b, the NOR circuit 6-1 disables the Y decoder 3-1.

First, when a defective memory cell is found in time memory cell block 1-1, the fuses $F_{11}, F_{11}', F_{12}, F_{12}', \ldots, F_{1n}, F_{1n}'$, are trimmed by a laser, so that a defective column address indicating this defective memory cell is written into the redundancy Y decoder 5-1a. Further, when another defective memory cell is found in the memory cell block 1-1, the fuses $F_{21}, F_{21}', F_{22}, F_{22}', \ldots, F_{2n}, F_{2n}'$ are trimmed by a laser, so that another defective column address indicating this second defective memory cell is written into the redundancy Y decoder 5-1b.

When the Y address signal $AD_Y$ defined by bits $Y_1, \overline{Y}_1, Y_2, \overline{Y}_2, \ldots, Y_n, \overline{Y}_n$ does not coincide with any of the defecitve column addresses written into the redundancy Y decoders 5-1a and 5-1b, at least one of the transistors $Q_{11}, Q_{11}', Q_{12}, Q_{12}', \ldots, Q_{1n}, Q_{1n}'$ connected to the non-melted fuses and at least one of the transistor $Q_{21}, Q_{21}', Q_{22}, Q_{22}', \ldots, Q_{2n}, Q_{2n}'$ connected to the non-melted fuses are turned ON, so that the voltages at nodes $N_1$ and $N_2$ become low (=GND). As a result, the redundancy column selection signals $RCS_{11}$ and $RCS_{12}$ are both high, and the output of the NOR circuit 6-1 is high. Thus, one column of the normal cell array of the memory cell block 1-1 is selected.

On the other hand, when the Y address signal $AD_Y$ defined by the bits $Y_1, \overline{Y}_1, Y_2, \overline{Y}_2, \ldots, Y_n, \overline{Y}_n$ coincides with the defective column address written into the redundancy Y decoder such as 5-1a, all the turned ON ones of the transistors $Q_{11}, Q_{11}', Q_{12}, Q_{12}', \ldots, Q_{1n}, Q_{1n}'$ are connected to melted fuses, so that the voltage at the node $N_1$ remains high the same as when precharged with the transistor $Q_{10}$.

Therefore, when the voltage of the block selection signal BK1 becomes high, the redundancy column selection signal $RCS_{11}$ is low and the output of the NOR circuit 6-1 is low. Thus, the normal cell array of the memory cell block 1-1 is disabled, and instead of this, the redundancy memory cell column 1-1a is selected. In other words, a defective memory cell column of the mormal cell array of the memory cell block 1-1 is replaced with the redundancy memory cell column 1-1a.

Note that the memory cell block 1-2 (1-3, 1-4) the X decoder 2-2 (2-3, 2-4), the Y decoder 3-2 (3-3, 3-4), the sense amplifier 4-2 (4-3, 4-4), and the redundancy Y decoders 5-2a, 5-2b (5-3a, 5-3b, 5-4a, 5-4b) have the same configuration as the memory cell block 1-1, the X decoder 2-1, the Y decoder 3-1, the sense amplifier 4-1, and the redundancy Y decoders 5-1a, 5-1b, respectively.

Here, in a 4 Mbit dynamic random access memory (DRAM) formed by four memory cell blocks, if the probability of relieving each memory cell block by its first column is 90% and the probability of relieving each memory cell block by its second redundancy memory cell column is 10%, the probability of relieving each memory cell block by its two redundancy memory cell columns is 100%, and accordingly, this DRAM can be completely relieved. In this example, if the second redundancy memory cell column is absent in each memory cell block, the probability of each memory cell block being relieved by its redundancy memory cell is 90%, and accordingly, the probability of relieving the DRAM is only 65% (=$0.9^4$). Thus, the second redundancy memory cell column is indispensible for each memory cell block.

Figure 3:
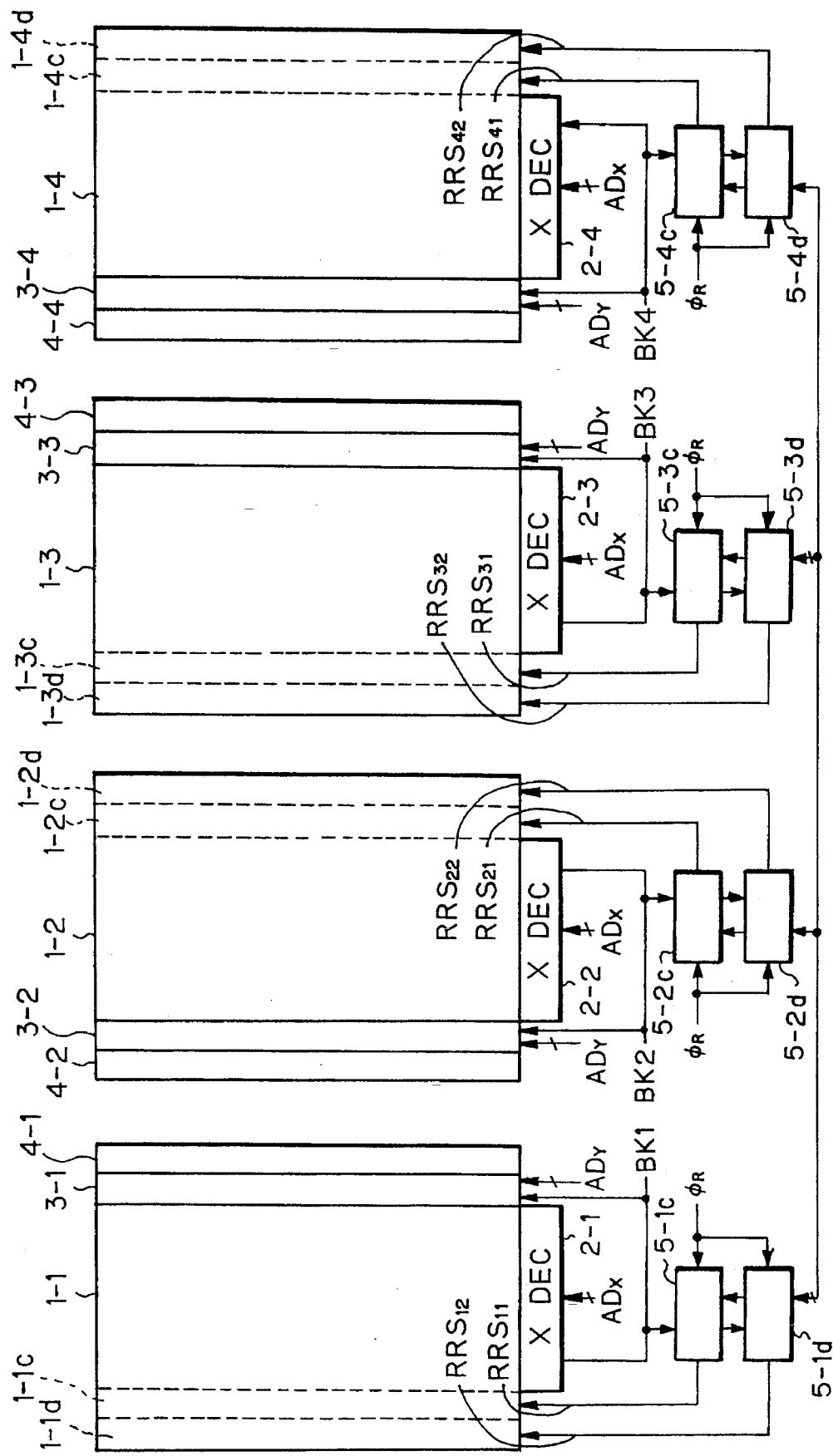
FIG. 3 is a block circuit diagram illustrating another prior art semiconductor memory device incorporating redundancy memory cells.

In FIG. 3, which illustrates another prior art semiconductor memory device, two redundancy memory cell rows such as 1-1c and 1-1d are incorporated into each of the memory cell blocks 1-1, 1-2, 1-3 and 1-4, instead of the two redundancy memory cell columns such as 1-1a and 1-1b. The redundancy memory cell rows 1-1c and 1-1d are selected by redundancy memory cell selection signals $RRS_{11}$ and $RRS_{12}$, respectively.

The redundancy memory cell rows 1-1c, 1-1d, 1-2c, 1-2d, 1-3c, 1-3d, 1-4c and 1-4d are selected by redundancy X decoders (redundancy row decoders) 5-1c, 5-1d, 5-2c, 5-2d, 5-3c, 5-3d, 5-4c and 5-4d, respectively, not by the X decoders 2-1, 2-2, 2-3 and 2-4.

Figure 4:
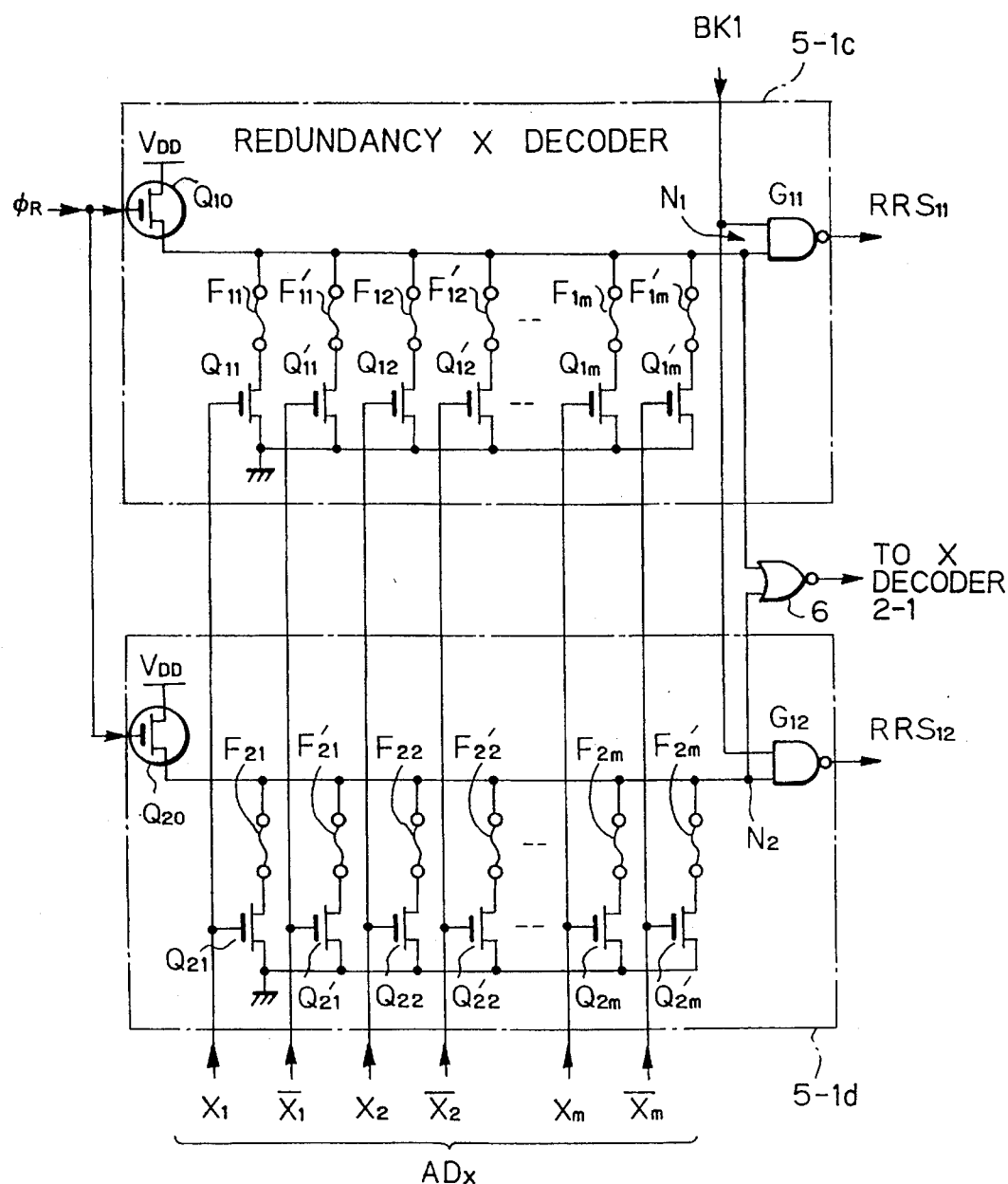
FIG. 4 is a circuit diagram of the redundancy row decoders of FIG. 3.

In FIG. 4, which is a detailed circuit diagram of the redundancy X decoders 5-1c and 5-1d of FIG. 3, the redundancy X decoders 5-1c and 5-1d have the same configuration as the redundancy Y decoders 5-1a and 5-1b of FIG. 2. However, the redundancy X decoders 5-1c and 5-1d receive X address signals $X_1, \overline{X}_1, X_2, \overline{X}_2, \ldots, X_m, \overline{X}_m$, not the Y address signal $Y_1, \overline{Y}_1, Y_2, \overline{Y}_2, \ldots, Y_n, \overline{Y}_n$.

The operation of the circuit of FIG. 4 is the same as that of the circuit of FIG. 2.

That is, when the X address signal $AD_X$ defined by bits $X_1, \overline{X}_1, X_2, \overline{X}_2, \ldots, X_n, \overline{X}_n$ does not coincide with any of the defecitve row addresses written into the redundancy X decoders 5-1c and 5-1d, at least one of the transistors $Q_{11}, Q_{11}', Q_{12}, Q_{12}', \ldots, Q_{1m}, Q_{1m}'$ connected to the non-melted fuses and at least one of the transistor $Q_{21}, Q_{21}', Q_{22}, Q_{22}', \ldots, Q_{2m}, Q_{2m}'$ connected to the non-melted fuses are turned ON, so that the voltages at nodes $N_1$ and $N_2$ become low (=GND). As a result, the redundancy row selection signals $RRS_{11}$ and $RRS_{12}$ are both high, and the output of the NOR circuit 6-1 is high. Thus, one row of the normal cell array of the memory cell block 1-1 is selected.

On the other hand, when the X address signal $AD_X$ defined by the bits $X_1, \overline{X}_1, X_2, \overline{X}_2, \ldots, X_m, \overline{X}_m$ coincides with the defecitve row address written into the redundancy X decoder such as 5-1c, all the turned ON ones of the transistors $Q_{11}$, $Q_{11}'$, $Q_{12}$, $Q_{12}'$, ..., $Q_{1m}$, $Q_{1m}'$ are connected to melted fuses, so that the voltage at the node $N_1$ remains high the same as when precharged with the transistor $Q_{10}$. Therefore, when the voltage of the block selection signal BK1 becomes high, the redundancy row selection signal $RRS_{11}$ is low and the output of the NOR circuit 6-1 is low. Thus, the normal cell array of the memory cell block 1-1 is disabled, and instead of this, the redundancy memory cell row 1-1c is selected. In other words, a defective memory cell row of the normal cell array of the memory cell block 1-1 is replaced with the redundancy memory cell row 1-1c.

Figure 5:
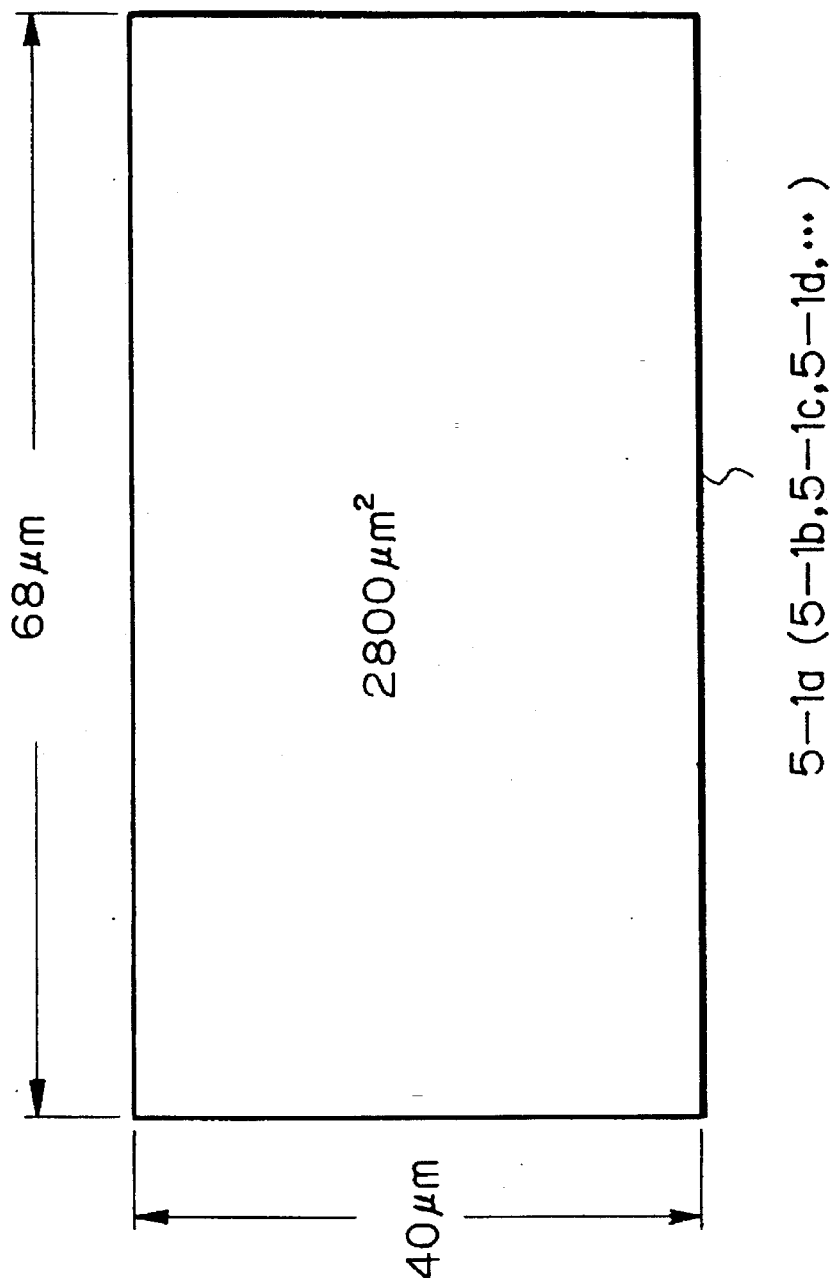
FIG. 5 is a diagram explaining the area of the redundancy decoder of FIGS. 1 and 3.

In the case of a 4 Mbit DRAM, each of the redundancy Y decoder such as 5-1a of FIG. 2 and the redundancy X decoder such as 5-1c has the following area. That is, in the abscissa direction, the width of a fuse and the interval of fuses is 3 μm to thereby surely carry our a laserr trimming. Also, a protection area having a width of 6 μm is provided on both sides. Thus, if the number of bits of the Y address signal $AD_Y$ or the X address signal $DA_X$ is 7, the width in the abscissa direction as shown in FIG. 5 is (1+3)·14+6·2=68 μm Also, in the ordinate direction, the length of each fuse including its protection area is 12 μm and a length of each transistor is 28 μm. Therefore, the length in the ordinate direction as shown in FIG. 5 is 12+28=40 μm Thus, an area of each redundancy decoder is 68·40≈2800 μm²

Also, in FIGS. 1 and 3, a total area of the redundancy decoders is

2800·8=22400 μm²

Thus, in FIGS. 1 and 3, the total area of the redundancy decoders is so large that a chip area of the device is increased, and accordingly, the integration of the device is reduced.

Figure 6:
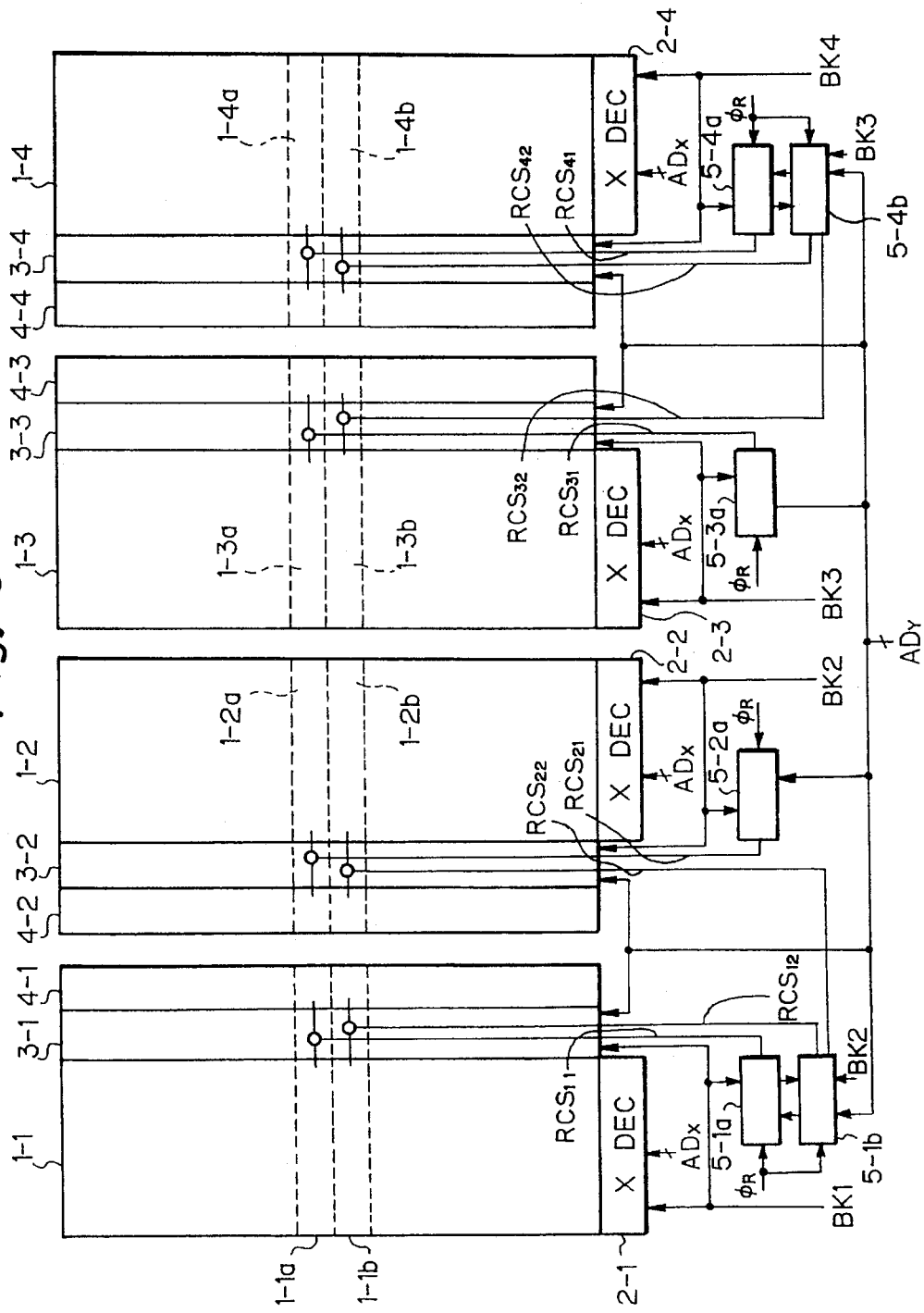
FIG. 6 is a block circuit diagram illustrating a first embodiment of the semiconductor memory device incorporating redundancy memory cells according to the present invention.

In FIG. 6, which illustrates a first embodiment of the present invention, a redundancy Y decoder 5-1b' is provided instead of the redundancy Y decoders 5-1b and 5-2b of FIG. 1. That is, the redundancy Y decoder 5-1b' is provided commonly for the redundancy memory cell column 1-1b of the memory cell block 1-1 and the redundancy memory cell column 1-2b of the memory cell block 1-2. In this case, the redundancy Y decoder 5-1b' receives both the memory cell block selection signals BK1 and BK2. Assume that the Y address signal $AD_Y$ defined by $Y_1$, $\overline{Y}_1$, $Y_2$, $\overline{Y}_2$, ..., $Y_n$, $\overline{Y}_n$ coincides with the defective column address written into the redundancy Y decoder 5-1b'. In this case, when the memory cell block selection signal BK1 is high, the redundancy column Y decoder 5-1b' makes the redundancy column selection signal $RCS_{12}$ low, thus selecting the redundancy memory cell column 1-1b. On the other hand, when the memory cell block selection signal BK2 is high, the redundancy column Y decoder 5-1b' makes the redundancy column selection signal $RCS_{22}$ low, thus selecting the redundancy memory cell column 1-2b.

Similarly, a redundancy Y decoder 5-4b' is provided instead of the redundancy Y decoders 5-3b and 5-4b of FIG. 1. That is, the redundancy Y decoder 5-4b' is provided commonly for the redundancy memory cell column 1-3b of the memory cell block 1-3 and the redundancy memory cell column 1-4b of the memory cell block 1-4. In this case, the redundancy Y decoder 5-4b' receives both the memory cell block selection signals BK3 and BK4. Assume that the Y address signal $AD_Y$ defined by $Y_1$, $\overline{Y}_1$, $Y_2$, $\overline{Y}_2$, ..., $Y_n$, $\overline{Y}_n$ coincides with the defective column address written into the redundancy Y decoder 5-4b'. In this case, when the memory cell block selection signal BK3 is high, the redundancy Y decoder 5-4b' makes the redundancy column selection signal $RCS_{32}$ low, thus selecting the redundancy memory cell column 1-3b. On the other hand, when the memory cell block selection signal BK4 is high, the redundancy Y decoder 5-4b' makes the redundancy column selection signal $RCS_{42}$ low, thus selecting the redundancy memory cell column 1-4b.

Figure 7:
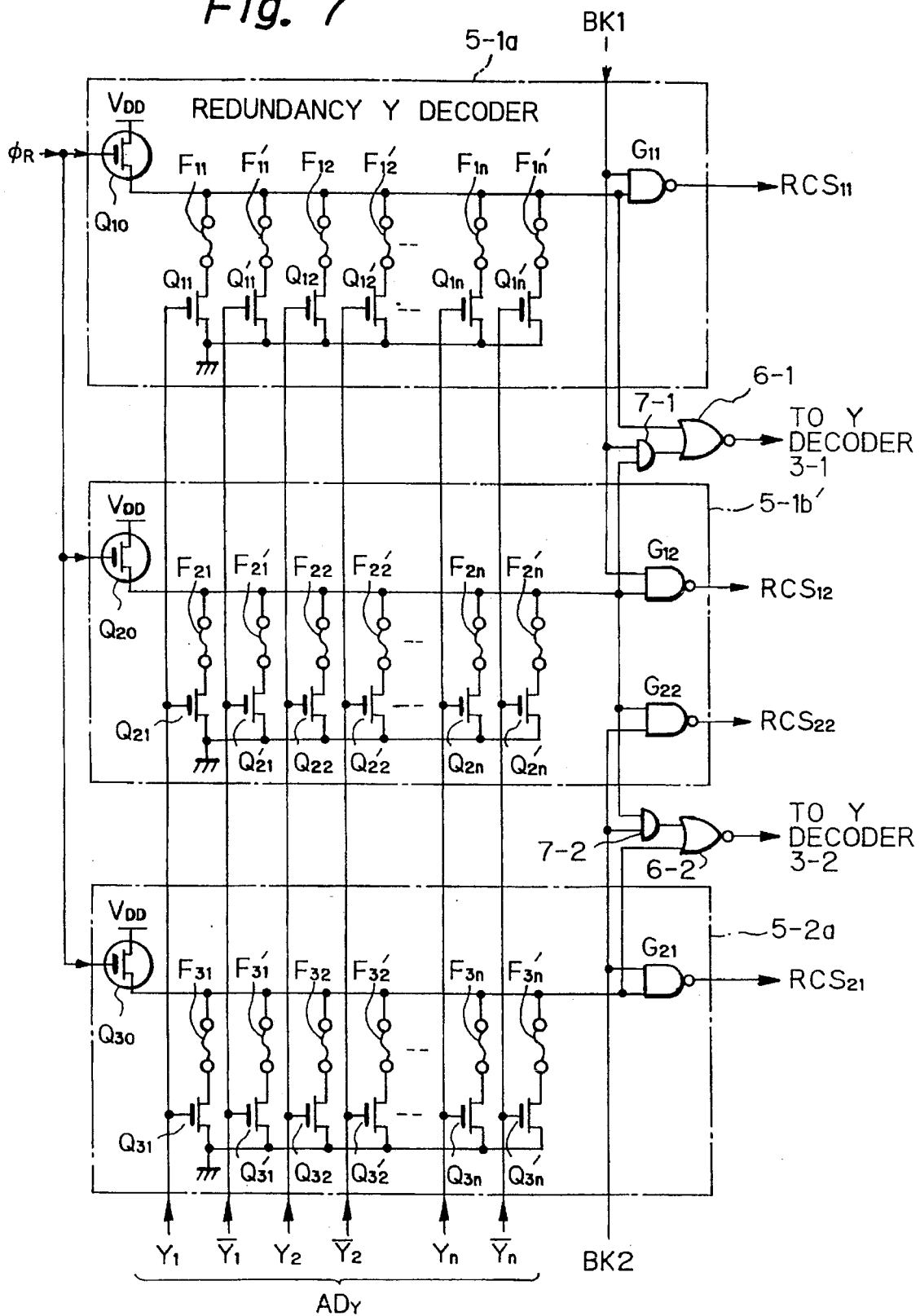
FIG. 7 is a circuit diagram of the redundancy column decoders of FIG. 6.

In FIG. 7, which is a detailed circuit diagram of the redundancy Y decoders 5-1a, 5-2a and 5-1b' of FIG. 6, the redundancy Y decoder 5-1b' has the same configuration as the redundancy Y decoder 5-1a and 5-2a, except that two NAND circuits $G_{12}$ and $G_{22}$ are provided. That is, when the memory cell block selection signal BK1 is high and the Y address signal defined by $Y_1$, $\overline{Y}_1$, $Y_2$, $\overline{Y}_2$, ..., $Y_n$, $\overline{Y}_n$ coincides with the defective column address defined by the fuses $F_{21}$, $F_{21}'$, $F_{22}$, $F_{22}'$, ..., $F_{2n}$, $F_{2n}'$, the output of the NAND circuit $G_{12}$, i.e., the redundancy column selection signal $RCS_{12}$ becomes high to select the redundancy memory cell column 1-1b. On the other hand, when the memory cell block selection signal BK2 is high and the Y address signal defined by $Y_1$, $\overline{Y}_1$, $Y_2$, $\overline{Y}_2$, ..., $Y_n$, $\overline{Y}_n$ coincides with the defective column address defined by the fuses $F_{21}$, $F_{21}'$, $F_{22}$, $F_{22}'$, ..., $F_{2n}$, $F_{2n}'$, the output of the NAND circuit $G_{22}$, i.e., the redundancy column selection signal $RCS_{22}$ becomes high to select the redundancy memory cell column 1-2b.

Also, in FIG. 7, the NOR circuit 6-1 receives the precharged voltage of the redundancy Y decoder 5-1a and the precharged voltage of the redundancy Y decoder 5-1b' via an AND circuit 7-1, to thereby disable the Y decoder 3-1 when one of the redundancy memory cell columns 1-1a and 1-1b is selected. Note that the AND circuit 7-1 is activated by the memory cell block signal BK1. Similarly, the NOR circuit 6-2 receives the precharged voltage of the redundancy Y decoder 5-2a and the precharged voltage of the redundancy Y decoder 5-1b' via an AND circuit 7-2, to thereby disable the Y decoder 3-2 when one of the redundancy memory cell columns 1-2a and 1-2b is selected. Note that the AND circuit 7-2 is activated by the memory cell block signal BK2.

Figure 8:
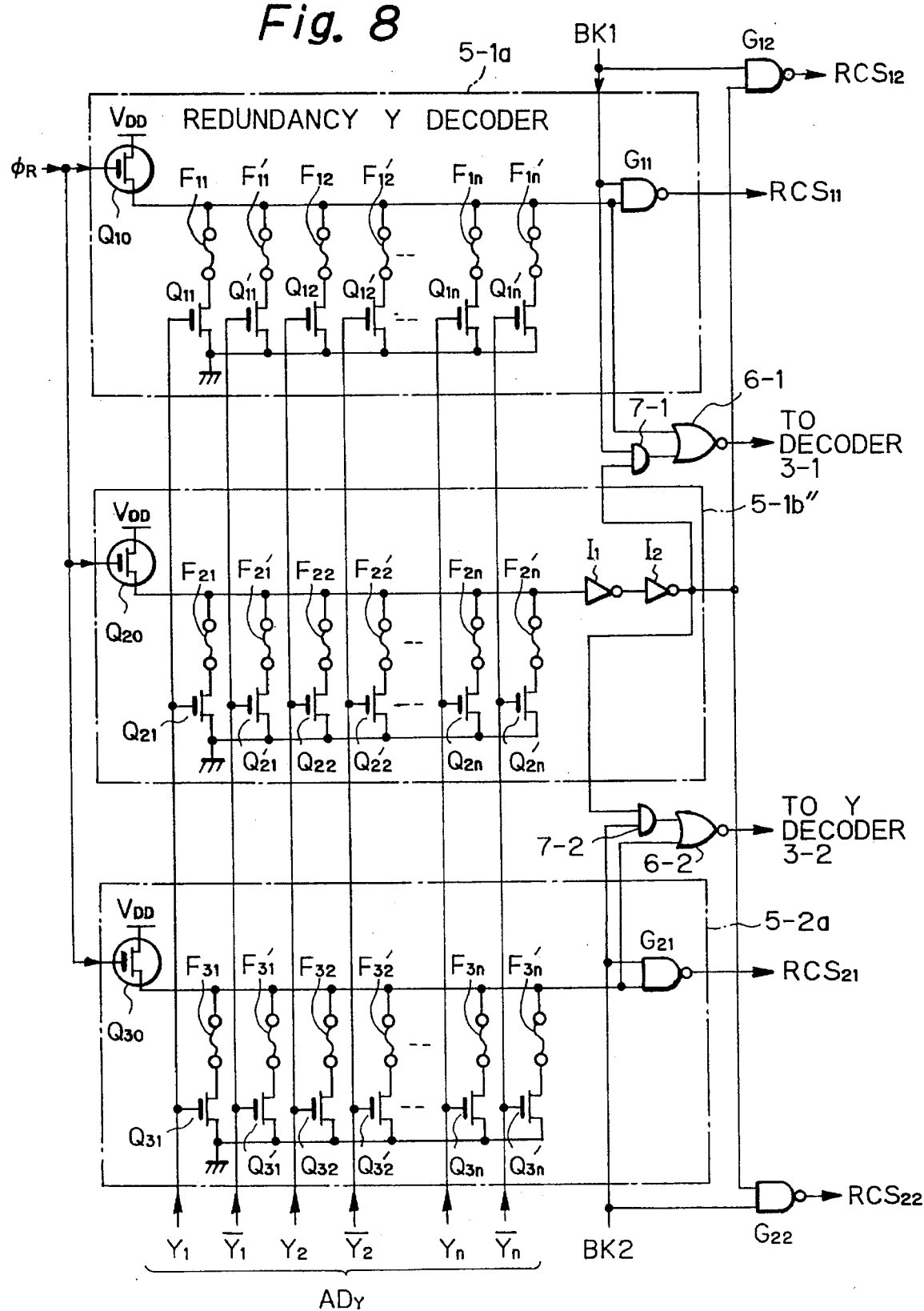
FIG. 8 is a circuit diagram illustrating a modification of FIG. 7.

In FIG. 8, which is a modification of the circuit of FIG. 7, the redundancy Y decoder 5-1b' of FIG. 7 is modified into a redundancy Y decoder 5-1b''. That is, the NAND circuits $G_{12}$ and $G_{22}$ are apart from the redundancy Y decoder 5-1b'', and, in order to compensate for a long distance therebetween, inverters $I_1$ and $I_2$ are added. Since the NAND circuits $G_{12}$ and $G_{22}$ receive the memory cell block selection signals BK1 and BK2, respectively, the NAND circuits $G_{12}$ and $G_{22}$ are located in accordance with the location of signal lines of the memory cell block selection signals BK1 and BK2. As a result, the NAND circuits $G_{12}$ and/or $G_{22}$ are distant from the redundancy Y decoder 5-1b''. This can be compensated for by the inverters $I_1$ and $I_2$.

In FIG. 6, the total area of the redundancy decoders is $$2800 \cdot 6 = 16800 \text{ μm}^2 \qquad (2)$$

Therefore, the total area of the redundancy decoders can be reduced by about 25 percent as compared with the prior art (see formula (1)), so that the integration of the device can be enhanced.

Here, in FIG. 6, if the probability of relieving each of the memory cell blocks 1-1 and 1-2 by its first redundancy memory cell column such as 1-1a is 90% and the probability of relieving each of the memory cell blocks 1-1 and 1-2 by its second redundancy memory cell column such as 1-1b is 10%, since it is impossible to simultaneously relieve two defective memory cells for each of the memory cell blocks 1-1 and 1-2, the probability of relieving each of the memory cell blocks 1-1 and 1-2 by its two redundancy memory cell columns is $$(1-0.1^2)=99\%$$

Similarly, the probabity of relieving each of the memory cell blocks 1-3 and 1-4 by its two redundancy memory cell columns is $$(1-0.1^2)=99\%$$

Therefore, the probability of relieving the device is $$(1-0.1^2) \cdot (1-0.1^2)=98\%$$

Particularly, if a column address of a defective memory cell found in the memory cell block 1-1 is the same as a column address of a defective memory cell found in the memory cell block 1-2, this column address is written into the redundancy Y decoder 5-1b', thus slightly raising the probalility of relieving the device.

Thus, in the first embodiment, the probability of relieving the device is not so reduced.

Figure 9:
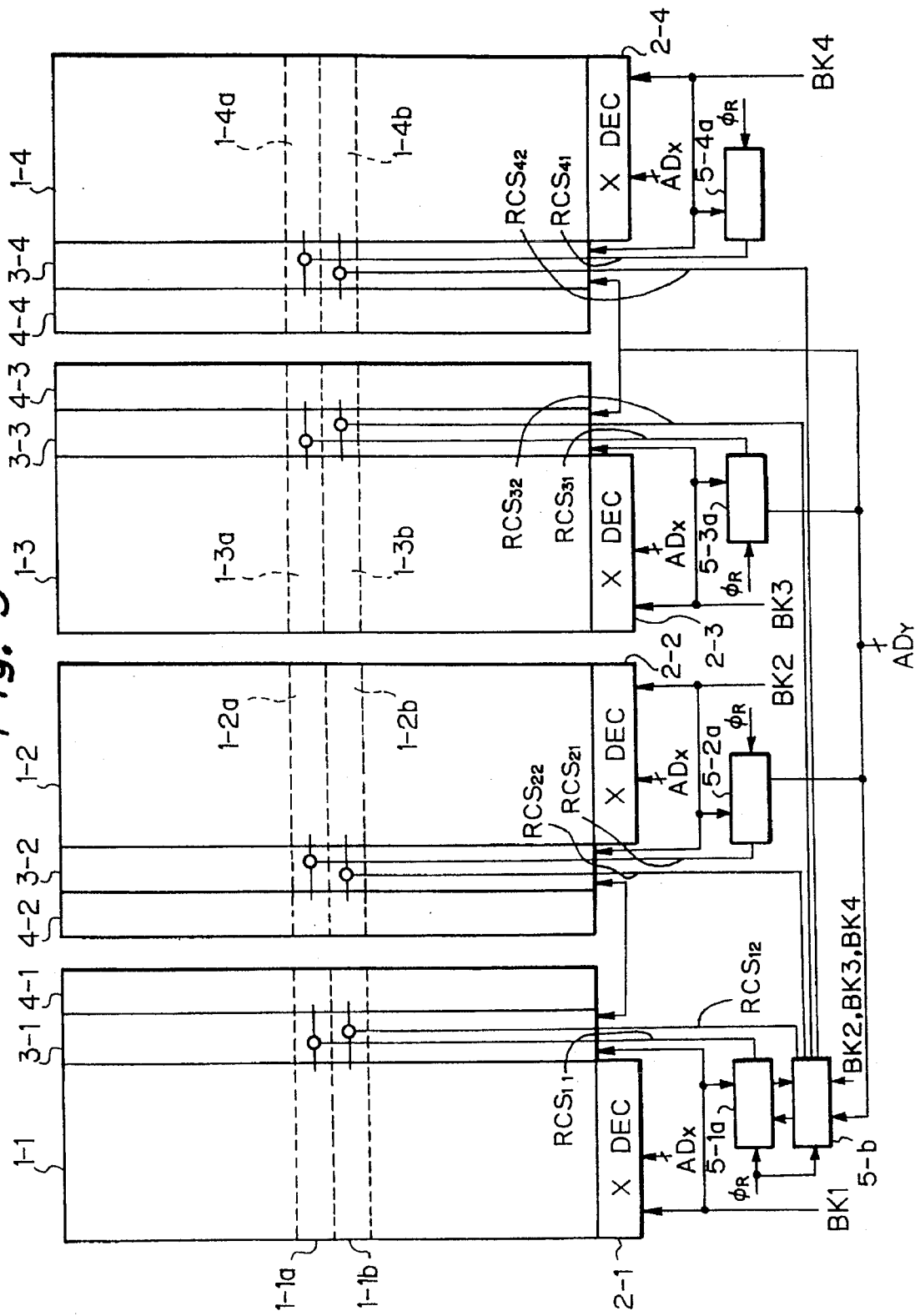
FIG. 9 is a block circuit diagram illustrating a second embodiment of the semiconductor memory device incorporating redundancy memory cells according to the present invention.

In FIG. 9, which illustrates a second embodiment of the present invention, a redundancy Y decoder 5-b is provided instead of the redundancy Y decoders 5-1b, 5-2b, 5-3b and 5-4b of FIG. 1. That is, the redundancy Y decoder 5-b is provided commonly for the redundancy memory cell column 1-1b of the memory cell block 1-1, the redundancy memory cell column 1-2b of the memory cell block 1-2, the redundancy memory cell column 1-3b of the memory cell block 1-3 and the redundancy memory cell column 1-4b of the memory cell block 1-4. In this case, the redundancy Y decoder 5-b receives all the memory cell block selection signals BK1, BK2, BK3 and BK4. Assume that the Y address signal $AD_Y$ defined by $Y_1, \overline{Y}_1, Y_2, \overline{Y}_2, \ldots, Y_n, \overline{Y}_n$ coincides with the defective column address written into the redundancy Y decoder 5-b. In this case, when the memory cell block selection signal BK1 is high, the redundancy column Y decoder 5-b makes the redundancy column selection signal $RCS_{12}$ low, thus selecting the redundancy memory cell column 1-1b. Also, when the memory cell block selection signal BK2 is high, the redundancy column Y decoder 5-1b' makes the redundancy column selection signal $RCS_{22}$ low, thus selecting the redundancy memory cell column 1-2b. Further, when the memory cell block selection signal BK3 is high, the redundancy column Y decoder 5-b makes the redundancy column selection signal $RCS_{32}$ low, thus selecting the redundancy memory cell column 1-3b. Further, when the memory cell block selection signal BK4 is high, the redundancy column Y decoder 5-b makes the redundancy column selection signal $RCS_{42}$ low, thus selecting the redundancy memory cell column 1-4b.

Figure 10:
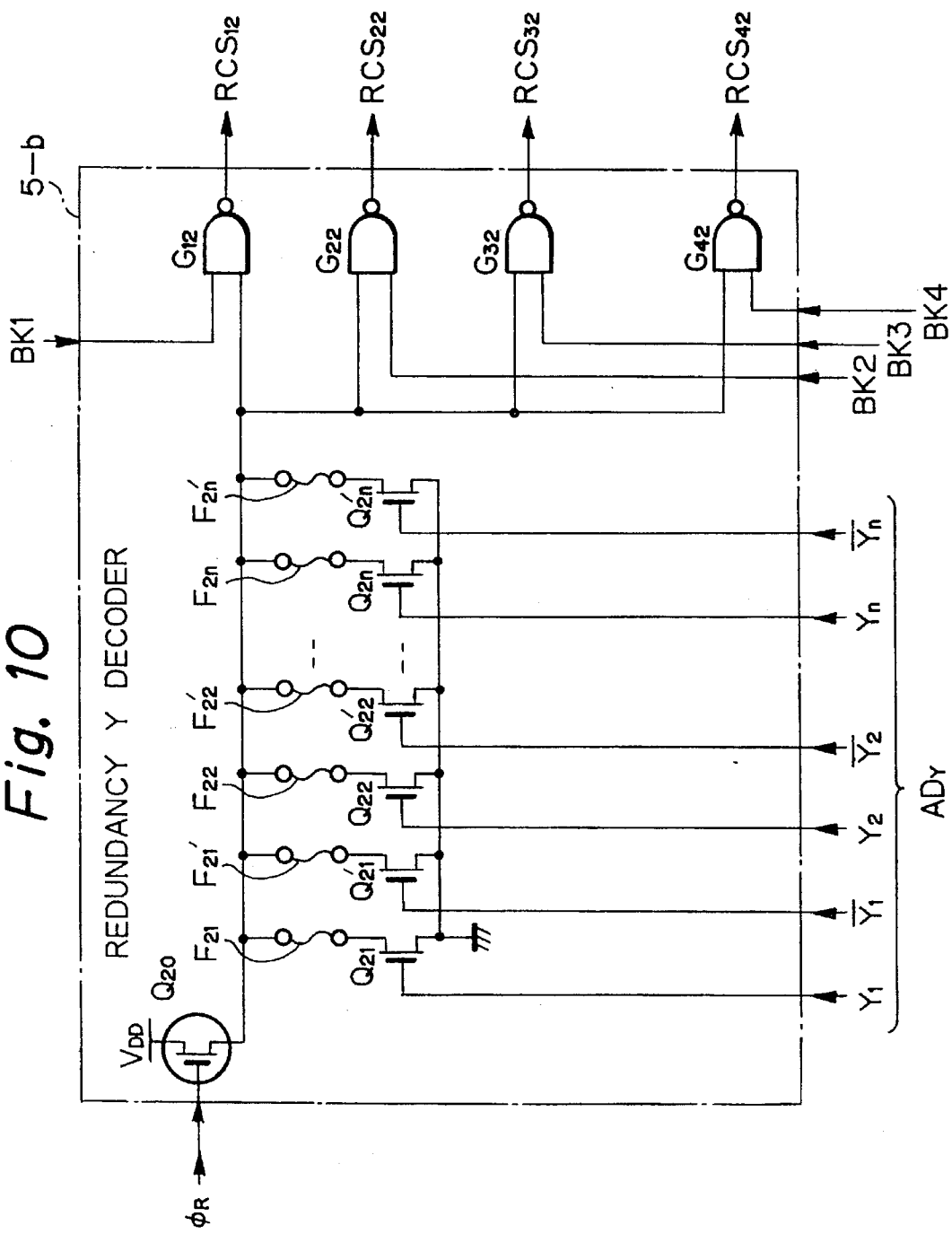
FIG. 10 is a circuit diagram of the redundancy column decoders of FIG. 9.

In FIG. 10, which is a detailed circuit diagram of the redundancy Y decoder 5-b, of FIG. 9, the redundancy Y decoder 5-b has the same configuration as the redundancy Y decoder 5-1b' except that two additional NAND circuits $G_{32}$ and $G_{42}$ are provided. That is, when the memory cell block selection signal BK1 is high and the Y address signal defined by $Y_1, \overline{Y}_1, Y_2, \overline{Y}_2, \ldots, Y_n, \overline{Y}_n$ coincides with the defective column address defined by the fuses $F_{21}, F_{21}', F_{22}, F_{22}', \ldots, F_{2n}, F_{2n}'$ the output of the NAND circuit $G_{12}$, i.e., the redundancy column selection signal $RCS_{12}$ becomes high to select the redundancy memory cell column 1-1b. Also, when the memory cell block selection signal BK2 is high and the Y address signal defined by $Y_1, \overline{Y}_1, Y_2, \overline{Y}_2, \ldots, Y_n, \overline{Y}_n$ coincides with the defective column address defined by the fuses $F_{21}, F_{21}', F_{22}, F_{22}', \ldots, F_{2n}, F_{2n}'$, the output of the NAND circuit $G_{22}$, i.e., the redundancy column selection signal $RCS_{22}$ becomes high to select the redundancy memory cell column 1-2b. Further, when the memory cell block selection signal BK3 is high and the Y address signal defined by $Y_1, \overline{Y}_1, Y_2, \overline{Y}_2, \ldots, Y_n, \overline{Y}_n$ coincides with the defective column address defined by the fuses $F_{21}, F_{21}', F_{22}, F_{22}', \ldots, F_{2n}, F_{2n}'$, the output of the NAND circuit $G_{32}$, i.e., the redundancy column selection signal $RCS_{42}$ becomes high to select the redundancy memory cell column 1-3b. Further, when the memory cell block selection signal BK4 is high and the Y address signal defined by $Y_1, \overline{Y}_1, Y_2, \overline{Y}_2, \ldots, Y_n, \overline{Y}_n$ coincides with the defective column address defined by the fuses $F_{21}, F_{21}', F_{22}, F_{22}', \ldots, F_{2n}, F_{2n}'$, the output of the NAND circuit $G_{42}$, i.e., the redundancy column selection signal $RCS_{42}$ becomes high to select the redundancy memory cell column 1-4b.

Figure 11:
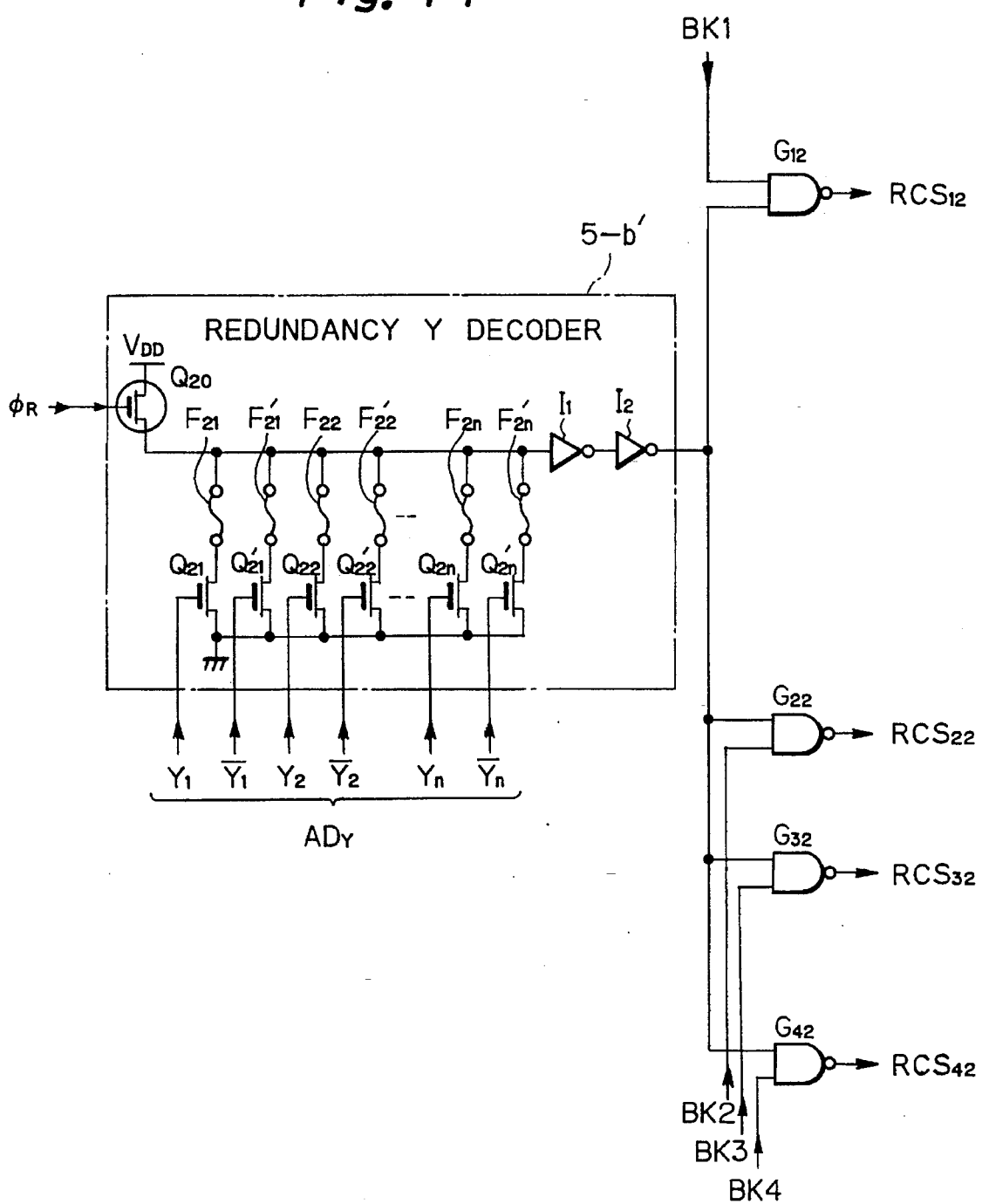
FIG. 11 is a circuit diagram illustrating a modification of the circuit of FIG. 10.

In FIG. 11, which is a modification of the circuit of FIG. 10, the redundancy Y decoder 5-b of FIG. 10 is modified into a redundancy Y decoder 5-b'. That is, the NAND circuits $G_{12}, G_{22}, G_{32}$ and $G_{42}$ are apart from the redundancy Y decoder 5-b', and, in order to compensate for a long distance therebetween, inverters $I_1$ and $I_2$ are added. Since the NAND circuits $G_{12}, G_{22}, G_{32}$ and $G_{42}$ receive the memory cell block selection signals BK1, BK2, BK3 and BK4, respectively, the NAND circuits $G_{12}, G_{22}, G_{32}$ and $G_{42}$ are preferably located in accordance with the location of signal lines of the memory cell block selection signals BK1, BK2, BK3 and BK4. As a result, some of the NAND circuits $G_{12}, G_{22}, G_{32}$ and $G_{42}$ are distant from the redundancy Y decoder 5-b'. This can be compensated for by the inverters $I_1$ and $I_2$.

Note that the NOR circuits such as 6-1 and 6-2 of FIG. 7 for disabling the Y decoders such as 3-1 and 3-2 are provided in the device of FIG. 9; however, these circuits are omitted therefrom to simplify the description.

In FIG. 9, the total area of the redundancy decoders is $$2800 \cdot 5 = 14000 \, \mu m^2 \qquad (3)$$

Therefore, the total area of the redundancy decoders can be reduced by about 38 percent as compared with the prior art (see formula (1)), so that the integration of the device can be further enhanced.

Again, in FIG. 9, if the probability of relieving each of the memory cell blocks 1-1, 1-2, 1-3 and 1-4 by its first redundancy memory cell column such as 1-1a is 90% and the probability of relieving each of the memory cell blocks 1-1 and 1-2 by its second redundancy memory cell column such as 1-1b is 10%, it is impossible for two of the memory cell blocks 1-1, 1-2, 1-3 and 1-4 to use the redundancy Y decoder 5-b simultaneously. This probability is $$0.1^2 \cdot {}_4C_2 = 0.01 \cdot 6 = 0.06.$$

Also, it is impossible for three of the memory cell blocks 1-1, 1-2, 1-3 and 1-4 to use the redundancy Y decoder 5-b simultaneously. This probability is $$0.1^3 \cdot {}_4C_3 = 0.001 \cdot 4 = 0.004.$$

Further, it is impossible for all the memory cell blocks 1-1, 1-2, 1-3 and 1-4 to use the redundancy Y decoder 5-b simultaneously. This probability is $0.1^4 \cdot {}_4C_4 = 0.0001 \cdot 1 = 0.00001$ Therefore, the probability of relieving the device is $1-(0.06+0.004+0.0001)=93.59\%$ Thus, in the second embodiment, the probability of relieving the device is not so reduced.

Figure 12:
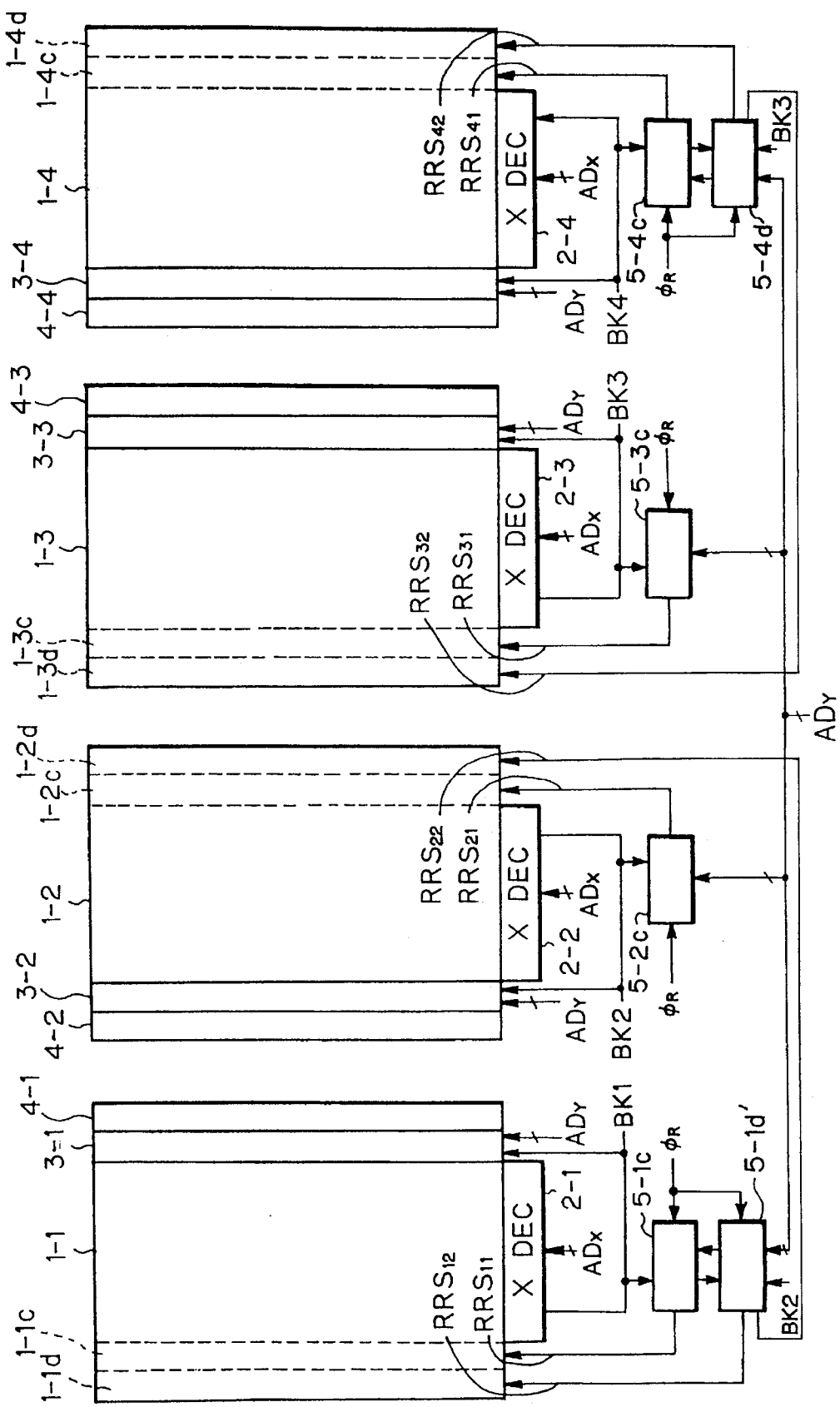
FIG. 12 is a block circuit diagram illustrating a third embodiment of the semiconductor memory device incorporating redundancy memory cells according to the present invention.

In FIG. 12, which illustrates a third embodement of the present invention, the first embodiment is applied to the device of FIG. 3. That is, a redundancy X decoder $5\text{-}1d'$ is provided commonly for the redundancy memory cell column $1\text{-}1b$ of the memory cell block $1\text{-}1$ and the redundancy memory cell column $1\text{-}2b$ of the memory cell block $1\text{-}2$. Also, a redundancy X decoder $5\text{-}4d'$ is provided commonly for the redundancy memory cell column $1\text{-}3b$ of the memory cell block $1\text{-}3$ and the redundancy memory cell column $1\text{-}4b$ of the memory cell block $1\text{-}4$.

The operation and effect of the third embodiment are basically the same as those of the first embodiment.

Figure 13:
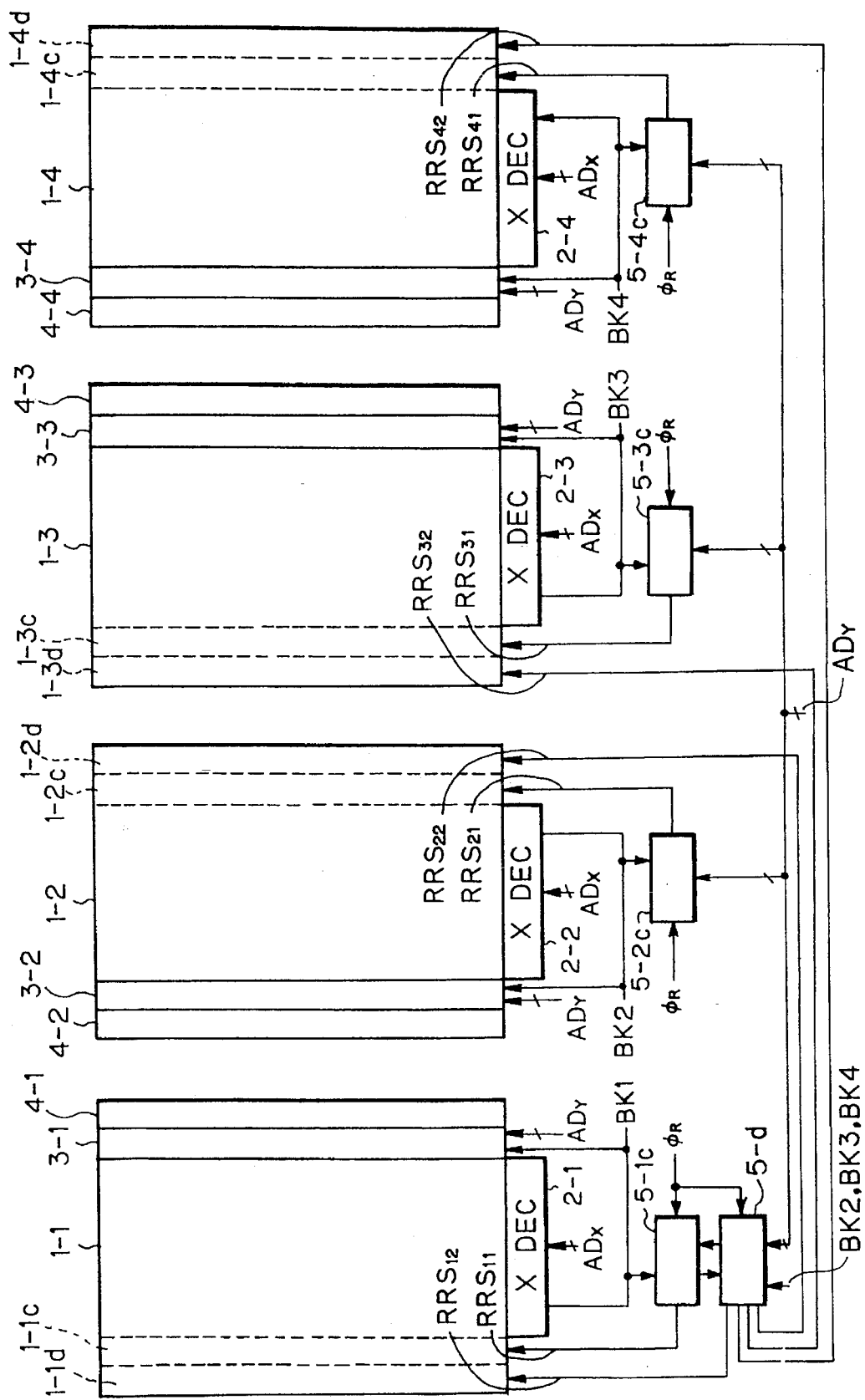
FIG. 13 is a block circuit diagram illustrating a fourth embodiment of the semiconductor memory device incorporating redundancy memory cells according to the present invention.

In FIG. 13, which illustrates a fourth embodiment of the present invention, the second embodiment is applied to the device of FIG. 3. That is, a redundancy X decoder $5\text{-}d$ is provided commonly for the redundancy memory cell column $1\text{-}1b$ of the memory cell block $1\text{-}1$, the redundancy memory cell column $1\text{-}2b$ of the memory cell block $1\text{-}2$, the redundancy memory cell column $1\text{-}3b$ of the memory cell block $1\text{-}3$ and the redundancy memory cell column $1\text{-}4b$ of the memory cell block $1\text{-}4$.

The operation and effect of the third embodiment are basically the same as those of the first embodiment.

Although the above-described embodiments relate to a semiconductor memory device having four memory cell blocks, the present invention can be applied to a semiconductor memory device having any number of memory cell blocks such as 32 memory cell blocks and 64 memory cell blocks.

As explained hereinbefore, according to the present invention, since the total area of redundancy decoders can be reduced, the integration of the device can be enhanced without substantially reducing the probability of relieving the device.

I claim:

1. A semiconductor memory device comprising:

a plurality of memory cell blocks each having a normal memory cell array and first and second redundancy memory cell columns;

a plurality of first redundancy column selecting means, each provided for one of said memory cell blocks and storing a first redundancy column address, each of said first redundancy column selecting means accessing said first redundancy memory cell column of a respective memory cell block in response to receiving a respective memory cell block selection signal and said first redundancy column address; and a plurality of second redundancy column selecting means, each provided for at least two of said memory cell blocks and storing a second redundancy column address, each of said second redundancy column selecting means accessing said second redundancy memory cell column of a respective memory cell block in response to receiving a respective memory cell block selection signal and said second redundancy column address.

2. A device as set forth in claim 1, wherein each of said first redundancy column selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of column address signals and their inverted signals; and a gate circuit having a first input connected to a first node between said precharging transistor and said fuses, a second input for receiving a respective memory cell block selection signal and an output for generating a selection signal for said first redundancy memory cell column of a respective memory cell block.

3. A device as set forth in claim 1, wherein each of said second redundancy column selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of column address signals and their inverted signals; and a plurality of gate circuits, each having a first input connected to a second node between said precharging transistor and said fuses, a second input for receiving a respective memory cell block selection signal and an output for generating a selection signal of said second redundancy memory cell column of a respective memory cell block.

4. A semiconductor memory device comprising:

a plurality of memory cell blocks each having a normal memory cell array and first and second redundancy memory cell columns;

a plurality of first redundancy column selecting means, each provided for one of said memory cell blocks and storing a first redundancy column address, each of said first redundancy column selecting means accessing said first redundancy memory cell column of a respective memory cell block in response to receiving a respective memory cell block selection signal and said first redundancy column address; and a single second redundancy column selecting means, provided for said memory cell blocks and storing a second redundancy column address, said second redundancy column selecting means accessing said second redundancy memory cell column of a respective memory cell block in response to receiving a respective memory cell block selection signal and said second redundancy column address.

5. A device as set forth in claim 4, wherein each of said first redundancy column selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of column address signals and their inverted signals; and a gate circuit having a first input connected to a first node between said precharging transistor and said fuses, a second input for receiving a respective memory cell block selection signal and an output for generating a selection signal for said first redundancy memory cell column of a respective memory cell block.

6. A device as set forth in claim 4, wherein said second redundancy column selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of column address signals and their inverted signals; and a plurality of gate circuits, each of said gate circuits being provided for one of said memory cell blocks, each of said gate circuits having a first input connected to a second node between said precharging transistor and said fuses, a second input for receiving a respective memory cell block selection signal and an output for generating a selection signal of said second redundancy memory cell column of a respective memory cell block.

7. A semiconductor memory device comprising:

a plurality of memory cell blocks each having a normal memory cell array and first and second redundancy memory cell rows;

a plurality of first redundancy row selecting means, each provided for one of said memory cell blocks and storing a first redundancy row address, each of said first redundancy row selecting means accessing said first redundancy memory cell row of a respective memory cell block in response to receiving a respective memory cell block selection signal and said first redundancy row address; and a plurality of second redundancy row selecting means, each provided for at least two of said memory cell blocks and storing a second redundancy row address, each of said second redundancy row selecting means accessing said second redundancy memory cell row of a respective memory cell block in response to receiving a respective memory cell block selection signal and said second redundancy row address.

8. A device as set forth in claim 7, wherein each of said first redundancy row selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of row address signals and their inverted signals; and a gate circuit having a first input connected to a first node between said precharging transistor and said fuses, a second input for receiving a respective memory cell block selection signal and an output for generating a selection signal for said first redundancy memory cell row of a respective memory cell block.

9. A device as set forth in claim 7, wherein each of said second redundancy row selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of row address signals and their inverted signals; and a plurality of gate circuits, each having a first input connected to a second node between said precharging transistor and said fuses, a second input for receiving a respective memory cell block selection signal and an output for generating a selection signal of said second redundancy memory cell row of a respective memory cell block.

10. A semiconductor memory device comprising:

a plurality of memory cell blocks each having a normal memory cell array and first and second redundancy memory cell rows;

a plurality of first redundancy row selecting means, each provided for one of said memory cell blocks and storing a first redundancy row address, each of said first redundancy row selecting means accessing said first redundancy memory cell row of a respective memory cell block in response to receiving a respective memory cell block selection signal and said first redundancy row address; and a single second redundancy row selecting means, provided for said memory cell blocks and storing a second redundancy row address, said second redundancy row selecting means accessing said second redundancy memory cell row of a respective memory cell block in response to receiving a respective memory cell block selection signal and said second redundancy row address.

11. A device as set forth in claim 10, wherein each of said first redundancy row selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of row address signals and their inverted signals; and a gate circuit having a first input connected to a first node between said precharging transistor and said fuses, a second input for receiving a respective memory cell block selection signal and an output for generating a selection signal for said first redundancy memory cell row of a respective memory cell block.

12. A device as set forth in claim 10, wherein said second redundancy row selecting means comprises:

a precharging transistor connected to a first power supply terminal;

a plurality of fuses connected to said precharging transistor;

a plurality of switching transistors each connected between one of said fuses and a second power supply terminal, each of said switching transistors being controlled by one of row address signals and their inverted signals; and a plurality of gate circuits, each of said gate circuits being provided for one of said memory cell blocks, each of said gate circuits having a first input connected to a second node between said precharging transistor and said fuses, a second input for receiving a respective memory cell block selection signal and an output for generating a selection signal of said second redundancy memory cell row of a respective memory cell block.

\* \* \* \* \*